US009182100B2

(12) United States Patent
Reingruber

(10) Patent No.: US 9,182,100 B2
(45) Date of Patent: Nov. 10, 2015

(54) LIGHTING DEVICE

(75) Inventor: Fabian Reingruber, Munich (DE)

(73) Assignee: OSRAM GmbH, Munich (DE)

( * ) Notice: Subject to any disclaimer, the term of this patent is extended or adjusted under 35 U.S.C. 154(b) by 127 days.

(21) Appl. No.: 14/002,760

(22) PCT Filed: Feb. 29, 2012

(86) PCT No.: PCT/EP2012/053437

§ 371 (c)(1),
(2), (4) Date: Sep. 3, 2013

(87) PCT Pub. No.: WO2012/117018

PCT Pub. Date: Sep. 7, 2012

(65) Prior Publication Data

US 2013/0335967 A1 Dec. 19, 2013

(30) Foreign Application Priority Data

Mar. 3, 2011 (DE) ......................... 10 2011 005 047

(51) Int. Cl.

| | |
|---|---|
| ***H01L 33/00*** | (2010.01) |
| ***F21V 7/00*** | (2006.01) |
| ***F21K 99/00*** | (2010.01) |
| ***F21V 29/70*** | (2015.01) |
| *F21Y 101/02* | (2006.01) |
| *F21Y 103/00* | (2006.01) |
| *F21Y 111/00* | (2006.01) |

(52) U.S. Cl.

CPC ... *F21V 7/00* (2013.01); *F21K 9/17* (2013.01); *F21V 29/70* (2015.01); *F21Y 2101/02* (2013.01); *F21Y 2103/003* (2013.01); *F21Y 2111/007* (2013.01)

(58) Field of Classification Search

CPC .................. H01L 2024/12041; H01L 33/507; H01L 24/32; H01L 33/46; H01L 33/08; H01L 33/10

USPC ......... 257/79, 80, 81, 83, 84, 88, 98, 99, 706, 257/707

See application file for complete search history.

(56) References Cited

U.S. PATENT DOCUMENTS

| | | | | |
|---|---|---|---|---|
| 5,698,866 | A * | 12/1997 | Doiron et al. | 257/99 |
| 5,936,353 | A | 8/1999 | Triner et al. | |
| 8,408,734 | B2 | 4/2013 | Wu et al. | |
| 2003/0160256 | A1 * | 8/2003 | Durocher et al. | 257/88 |
| 2005/0007033 | A1 | 1/2005 | Kan et al. | |
| 2007/0145398 | A1 * | 6/2007 | Shin | 257/98 |
| 2009/0032829 | A1 * | 2/2009 | Chew et al. | 257/98 |
| 2009/0046457 | A1 * | 2/2009 | Everhart | 362/235 |
| 2011/0073883 | A1 | 3/2011 | Osawa et al. | |
| 2012/0256205 | A1 * | 10/2012 | Low et al. | 257/88 |
| 2012/0307481 | A1 * | 12/2012 | Joo et al. | 362/97.1 |
| 2013/0009179 | A1 * | 1/2013 | Bhat et al. | 257/89 |
| 2013/0113002 | A1 * | 5/2013 | Radermacher | 257/88 |
| 2013/0169149 | A1 * | 7/2013 | Sato et al. | 313/512 |
| 2014/0131742 | A1 * | 5/2014 | Zykin et al. | 257/88 |
| 2014/0217434 | A1 * | 8/2014 | Hussell et al. | 257/89 |

FOREIGN PATENT DOCUMENTS

| | | | |
|---|---|---|---|
| DE | 102007024390 | A1 | 5/2008 |
| DE | 102008039364 | A1 | 3/2010 |

(Continued)

*Primary Examiner* — S. V. Clark

(57) ABSTRACT

A lighting device may include a plurality of semiconductor light sources arranged on a substrate which is brought into contact thermally with a heat sink, wherein the substrate is formed from a multiplicity of substrate modules which are held by a carrier and which each carry at least one semiconductor light source and are brought into contact electrically with one another.

16 Claims, 10 Drawing Sheets

(56) References Cited

FOREIGN PATENT DOCUMENTS

| | | | |
|---|---|---|---|
| DE | 202010007989 | U1 | 10/2010 |
| DE | 202010008114 | U1 | 10/2010 |
| EP | 2166273 | A2 | 3/2010 |
| EP | 2202446 | A2 | 6/2010 |
| EP | 2216858 | A2 | 8/2010 |
| JP | 2010129185 | A | 6/2010 |
| WO | 02097884 | A1 | 12/2002 |
| WO | 2009145247 | A1 | 12/2009 |
| WO | 2010110514 | A1 | 9/2010 |

* cited by examiner (Section A-A)

(Section B-B)

LIGHTING DEVICE

RELATED APPLICATIONS

This application is a national stage entry according to 35 U.S.C. §371 of PCT application No.: PCT/EP2012/053437 filed on Feb. 29, 2012, which claims priority from German application No.: 10 2011 005 047.7 filed on Mar. 3, 2011.

TECHNICAL FIELD

Various embodiments relate to a lighting device.

BACKGROUND

A lighting device of this type has a plurality of semiconductor light sources, which can be embodied for example by an LED or a multichip LED module. Said semiconductor light source is usually arranged on a carrier material—called substrate hereinafter—which consists of ceramic. The arrangement including substrate and semiconductor light source is brought into contact thermally with a heat sink, such that the heat that arises during the operation of a semiconductor light source can be dissipated in order to prevent the LEDs from overheating. The use of ceramic as substrate material has the advantage, inter alia, that the electronics of the luminaire are electrically isolated from the heat sink, thereby satisfying the requirements of the respective protection classes. In accordance with these requirements, the LED lighting devices have to be electrically insulated from the heat sink and air clearances and creepage paths between LED luminaire and heat sink have to be taken into account for this purpose. What is problematic here is that as a result of these measures the thermal linking of the semiconductor light source is impaired and the service life thereof is thus reduced.

Semiconductor light sources are often also used for achieving standard-conforming electrical insulation with complex SELV operating devices, which require a very large amount of space in order to comply with the necessary air clearances and creepage paths.

Lamps or luminaires can be subsumed under the term “lighting device”. In this regard, by way of example, OSRAM GmbH sells so-called LED retrofit tubes under the designation SubstiTUBE, which can be used as a replacement for conventional fluorescent lamps in luminaires, without necessitating a conversion of the luminaire. In the case of tubes of this type, a multiplicity of semiconductor light sources are arranged on the large-area substrate, which is very long in accordance with the tube shape. Both during production and in the installed state, these ceramic substrates can break in the event of slight bending of the luminaire. Furthermore, the ceramic materials required for producing such substrates are relatively expensive, and so the lamp price is determined not inconsiderably by the proportion of ceramic.

In conventional luminaires, too, such as are described for example in document DE 10 2008 039 364 A1, the semiconductor light sources are arranged on a ceramic substrate which is configured likewise with a large area or in very complex forms, depending on the geometry of the luminaire, with the result that the same problems as with the tubes occur.

SUMMARY

Against this background, the disclosure addresses the problem of providing a lighting device for which operating safety is improved with minimal outlay in respect of device technology.

Various embodiments provide a lighting device.

According to the various embodiments, the lighting device has a multiplicity of semiconductor light sources arranged on a substrate which, for its part, is indirectly or directly brought into contact thermally with a heat sink. The substrate consists of a multiplicity of modules which each carry at least one of the semiconductor light sources and which are interconnected with one another.

Various embodiments thus depart from the conventional solutions having a large-area substrate common to all the semiconductor light sources and uses small modules which are respectively assigned to at least one semiconductor light source and which are brought into contact electrically and/or thermally with one another and are held by a carrier. These comparatively small modules which carry the semiconductor light source significantly reduce any risk of damage to the substrate during production or during use of the lighting device in comparison with the background outlined in the introduction. Furthermore, cost-effective production of the lighting device is also possible since the material outlay is reduced on account of the use of a few small modules.

In one preferred embodiment, the substrate modules are attached to a reflector embodied as a carrier. The individual modules, consisting of ceramic, for example, are thus carried by the reflector, thereby further minimizing the material outlay for the cost-intensive ceramic substrate. Through suitable design of the reflector, the substrate construction can then be embodied with a stiffness and/or flexibility optimized for the respective application.

The modules are preferably substantially formed from ceramic. It goes without saying that other electrically insulating materials can also be used.

It is preferred if the reflector is assigned to a multiplicity of modules, such that a single reflector is used for a plurality of modules.

A reflector of this type can have a multiplicity of cutouts on the rear side, one of the modules respectively being inserted into each of said cutouts.

In one particularly preferred embodiment of the disclosure, each substrate module is embodied with at least two conductor tracks for making contact with the semiconductor light sources. Such conductor tracks can run approximately parallel, wherein one or a plurality of semiconductor light sources are arranged along one conductor track and the other conductor track runs approximately parallel thereto.

Preferably, the two conductor tracks are connected to one another at a substrate module arranged at the end side, in order to close the electric circuit.

In one embodiment of the disclosure, provision is made for joining together a plurality of semiconductor light sources to form a multichip LED module.

The individual substrate modules can be brought into contact via bridges which extend between the modules or between the conductor tracks of the modules.

Such bridges can be attached or integrated into a reflector or some other component of the lighting device.

According to the disclosure, it is preferred if the bridges provided for electrical contact-making are inserted into a reflector in a force-locking or positively locking manner.

In one embodiment of the disclosure, the modules are arranged, in a manner lying one behind another, in a tube formed by a cover and the heat sink.

Alternatively, however, the modules can also be embodied on arbitrarily shaped reflector bodies. In this regard, in one embodiment, provision is made for embodying the reflector body three-dimensionally in a pot-shaped fashion.

In order to improve the thermal contact-making and the breakdown strength, a correspondingly designed layer, for example composed of TIM (thermal interface material), can be embodied between substrate and heat sink. It goes without saying that the lighting device can also be embodied without such a TIM.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
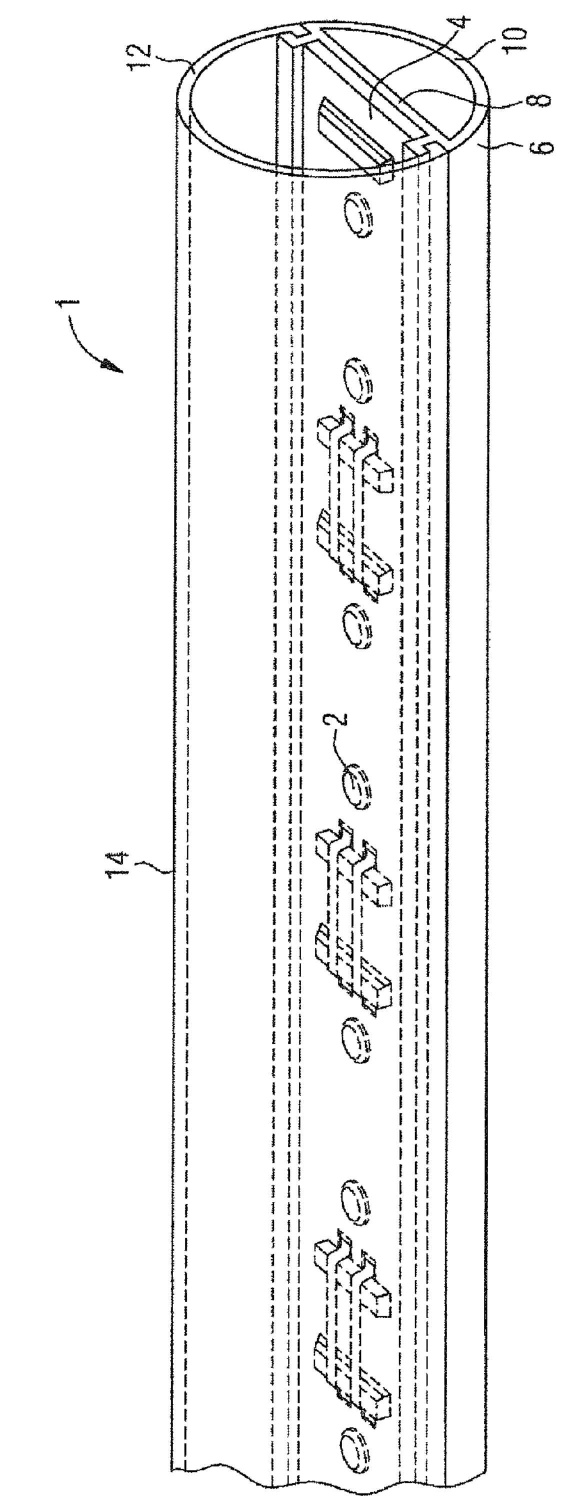
FIG. 1 shows a partial illustration of a retrofit LED lamp.

FIG. 1 shows a partial illustration of a retrofit LED lamp which can be inserted into a luminaire constructed in an earlier year, instead of a conventional fluorescent lamp.

Such a retrofit LED lamp 1 has a multiplicity of semiconductor light sources which, in the embodiment illustrated, are each embodied by an LED chip, hereinafter called LED 2 for short.

These are held by a reflector 4, on which a heat sink 6 is arranged at the rear side. With a planar section 8, said heat sink is indirectly or directly brought into contact thermally with the LEDs 2. The planar section 8 is adjoined by a lateral surface section 10 in the shape of a segment of a circle, which is supplemented together with an approximately semicircular transparent cover 12 to form a cylindrical tube, the diameter of which corresponds approximately to the external diameter of a conventional fluorescent lamp.

A base is formed in each case at the two end sections (not illustrated in FIG. 1) of this tube 14, wherein the power supply is implemented only at one of the bases and the geometry of the other base is embodied according to the base of conventional fluorescent lamps, such that the LED lamp 1 can be installed in the luminaire in the same way as the fluorescent lamp.

Figure 2:
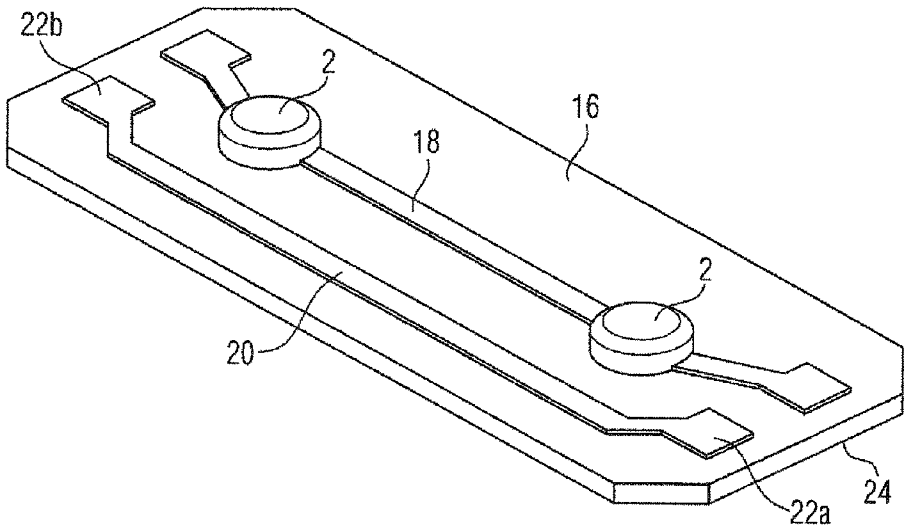
FIG. 2 shows a substrate module of the LED lamp from FIG. 1.

As can be gathered from FIG. 2, in particular, in the embodiment illustrated, two LEDs 2 are arranged on a substrate module 16, which is preferably produced from an insulating ceramic material. Two conductor tracks 18, 20 running approximately in the longitudinal direction are formed on the plate-shaped substrate module 16, said conductor tracks each being embodied with contact regions 22*a*, 22*b* at their end sections. The two LEDs 2 are brought into contact with the two conductor tracks 18, 20 along the latter and are thus connected in series; the specific electrical contact-making for the LEDs 2 is not shown. The contact regions 22 of the conductor tracks 18, 20 are arranged adjacent to narrow sides 24 of the respective substrate module 16, which to a first approximation is approximately rectangular. As is evident in particular from the enlarged illustration of a partial section of the tube 14 in FIG. 3, the substrate modules 16, indicated by dashed lines, are inserted in rear-side cutouts (further details will be explained later with reference to FIGS. 10 to 12) of the reflector 4, wherein the latter is embodied with a multiplicity of perforations 26 for in each case one of the LEDs 2. The individual substrate modules 16 are connected in series, wherein the electrical contact-making is effected via bridges 28, 30. The end sections thereof bent over into the plane of the modules 16 are then brought into contact with the mutually opposite contact regions 22*a*, 22*b* of the substrate modules 16, such that the latter are connected in series. In the embodiment illustrated, said end sections in each case extend through a cutout 32 of the reflector 4.

Figure 3:
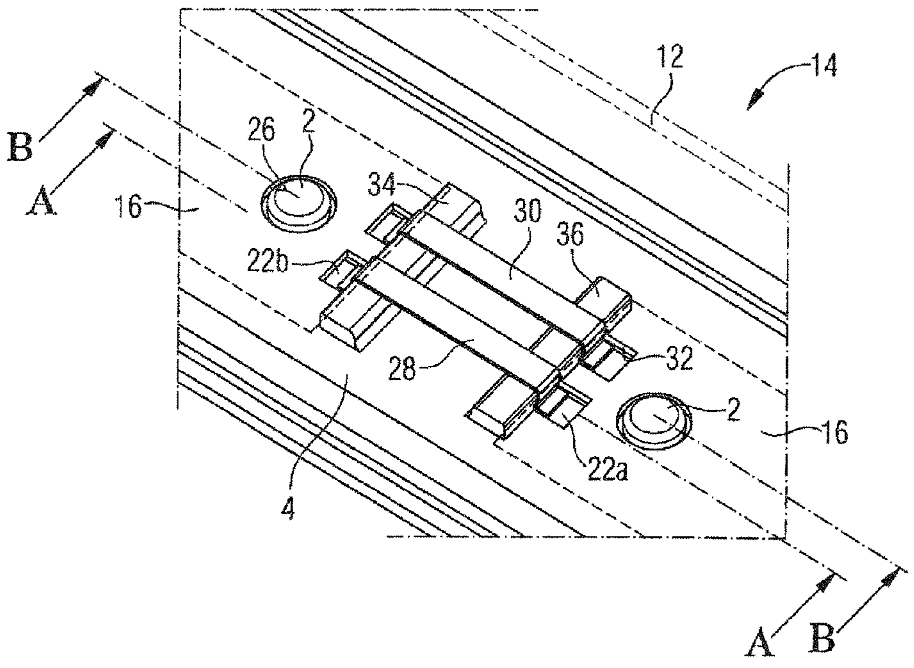
FIG. 3 shows a detail illustration of the LED lamp from FIG. 1.

Two supporting pedestals 34, 36 are formed on the top side (as viewed in the light emission direction) of the reflector 4, said supporting pedestals either being placed onto the reflector 4 or being formed integrally with the latter and each supporting the bridge limbs visible in FIG. 3. The end sections of the bridges 28, 30 are preferably clipped onto the associated supporting pedestals 34, 36, such that contact-making which exhibits high mechanical strength and is electrically reliable is present. This contact-making is brought about by a predetermined, comparatively low prestress between bridges 28, 30 and reflector 4, wherein said prestress is also influenced by the height of the supporting pedestals 34, 36.

Figure 4:
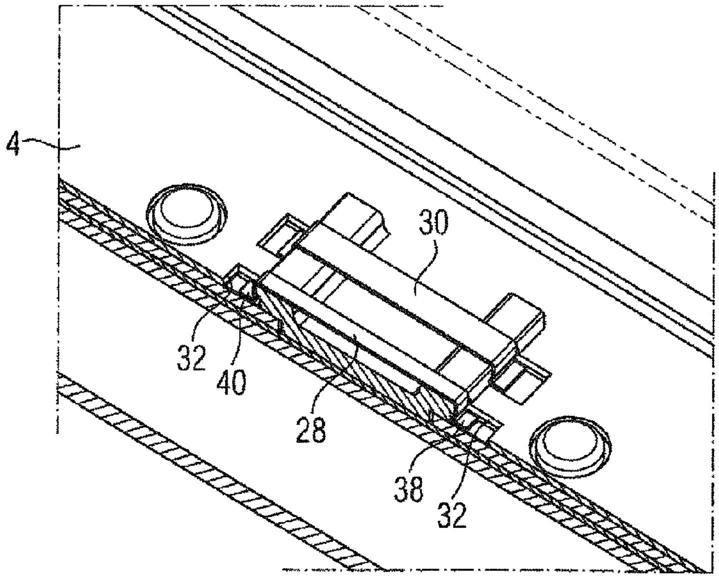
FIGS. 4 and 5 show sectional views through the partial region of an LED lamp that is illustrated in FIG. 3.

Further details become apparent from the sectional view along the line A-A in FIG. 3 that is illustrated in FIG. 4. Accordingly, the two bridges 28, 30 are embodied approximately in the form of clamps, wherein end sections 38, 40 reach around and behind the outer circumferential edges of the two supporting pedestals 34, 36 and then bear on the contact regions 22*a*, 22*b* (see FIG. 5) through the cutouts 32.

Figure 5:
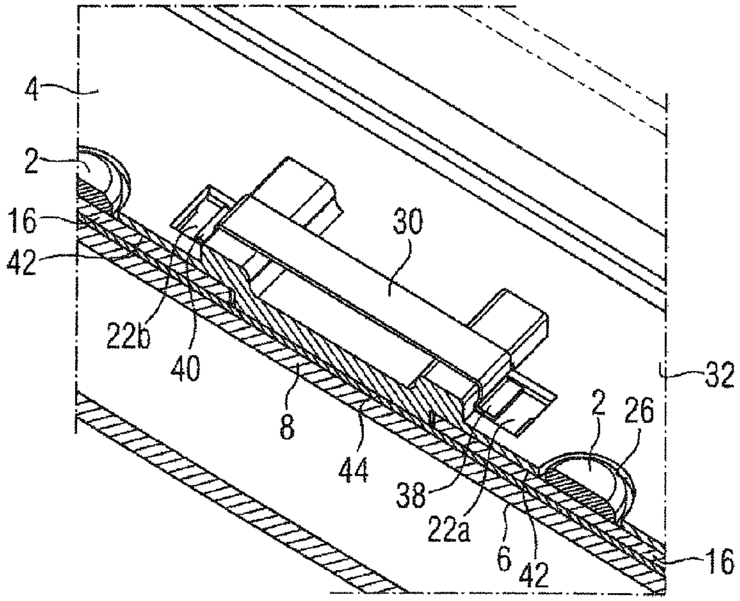

FIG. 5 shows a somewhat enlarged sectional view along the line B-B in FIG. 3. This illustration clearly reveals the rear-side cutouts 42 of the reflector 4, the modules 16 being inserted into said cutouts in a positively locking manner, such that the LEDs 2 extend through the respective perforation 26. A layer composed of TIM (thermal interface material) 44 is provided at the rear side, i.e. at the large surface of the reflector 4 facing away from the LEDs 2, said layer thus being arranged between the reflector 4 or the modules 16 inserted into the cutouts 42 and the planar section 8 of the heat sink 6. The TIM 44 provides for a good heat transfer from the LEDs 2 to the heat sink 6. Furthermore, taking account of the specific requirements, such as, for example, the breakdown strength, together with the modules 16, the TIM 44 forms a construction that conforms with the applicable safety regulations. At the present time, the distance between an LED 2 (and the conductor track 18, 20) and the TIM 44 should be 1.5 mm and the distance between the TIM 44 and the heat sink 6 should be 2.5 mm. However, embodiments which are embodied without a TIM are also possible; in this case, however, it is necessary to maintain higher distances between LED and heat sink.

In the embodiment illustrated, the actual stabilization of the construction is effected by fixing the reflector 4 on the heat sink 6 in the shape of a segment of a circle. This fixing is formed in such a way that the reflector 4 and thus also the modules 16 carrying the LEDs 2 and the TIM layer 44 are pressed against the heat sink 6. The prestress pressure of the bridges 28, 30 with their metal spring contacts is also maintained by means of this fixing.

Figure 6:
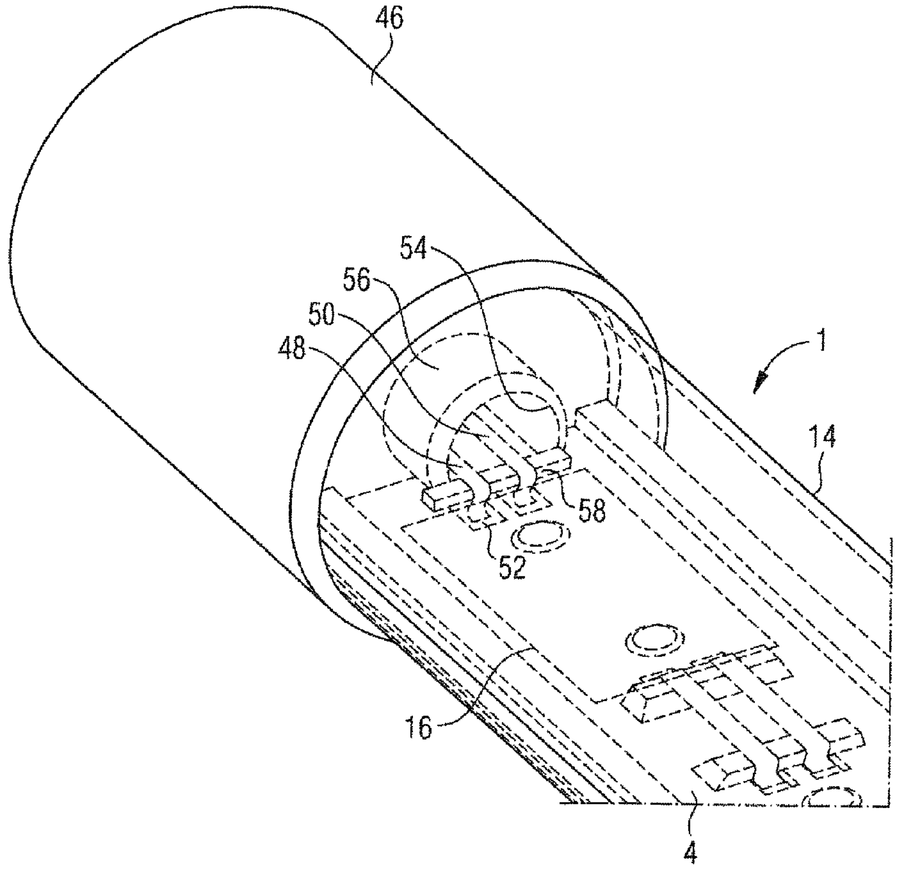
FIG. 6 shows a connection-side end section of the luminaire from FIG. 1.

FIG. 6 shows a power-supply-side end section of the luminaire 1. A base 46 attached to the cylindrical tube 14 can be discerned, said base being embodied according to the geometry of the conventional fluorescent lamps. The individual modules 16 connected in series are energized via said base 46. In this embodiment, the power supply is effected via specially insulated planar power supply wires 48, 50 which, through corresponding cutouts 52 of the reflector 4, are brought into contact with the contact regions 22 of the adjacent substrate module 16, which is merely indicated in FIG. 6. In this case, the two power supply wires 48, 50 are designed such that they are positionally fixed on the support 58 in a force-locking and/or positively locking manner by prestress and reliable contact-making is thus ensured. For leading the power supply wires 48, 50 through the base 46, an approximately circular channel 54 is formed in said base, the power supply wires 48, 50 passing through said channel. On the tube side, said channel 54 opens via a hub section 56 in the tube 14. This hub-shaped hub section 56, which is flattened downwards (in the direction of the reflector 4) bears on a support 58 of the reflector 4. In a similar manner to the supporting pedestals 34, 36, these can be integral with the reflector 4 or placed onto the latter.

Figure 7:
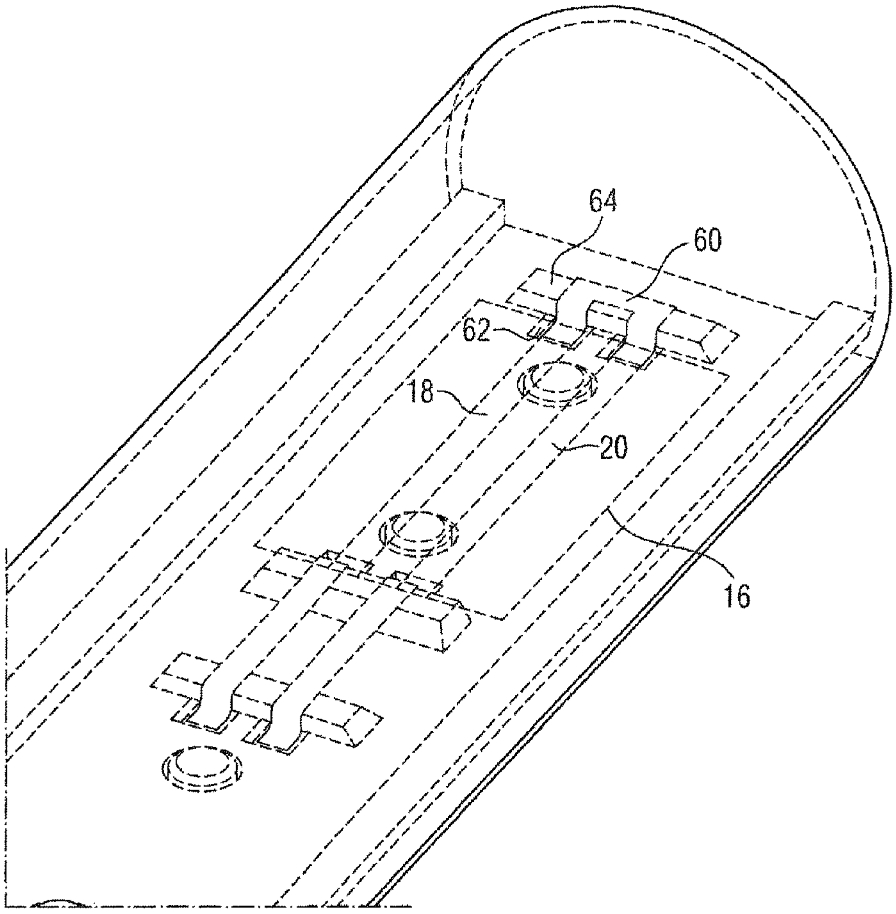
FIG. 7 shows a connection-remote end section of the luminaire from FIG. 1.

The substrate module 16 remote from the base 46 illustrated in FIG. 6 closes the electric circuit in which it directly electrically connects the two contact tracks 18, 20 to one another, said contact tracks likewise being indicated by dashed lines. This may be effected by corresponding configuration of the two conductor tracks 18, 20. FIG. 7 shows an embodiment in which all the substrate modules 16 are embodied substantially identically. The electrical connection is then effected by attaching a bridge clip 60, which extends with its end sections through windows 62 of the reflector 4 to the contact regions 22 of the conductor tracks 18, 20 and bears with prestress on the latter. The clamp-like bridge clip 60 is clipped onto a bridge bearing 64, the outer contour of which is profiled similarly to the supporting pedestals 34, 36, such that the bridge clip 60 with correspondingly shaped holding limbs is fixed in a positively locking and force-locking manner on the bridge bearing 64. The latter can in turn be placed onto the reflector 4 or be embodied integrally therewith. The contact-connection of the power supply leads and the closing of the electric circuit are effected with minimal outlay in terms of device technology, without costly soldering or welding technology, with the result that the assembly costs are minimal.

Figure 8:
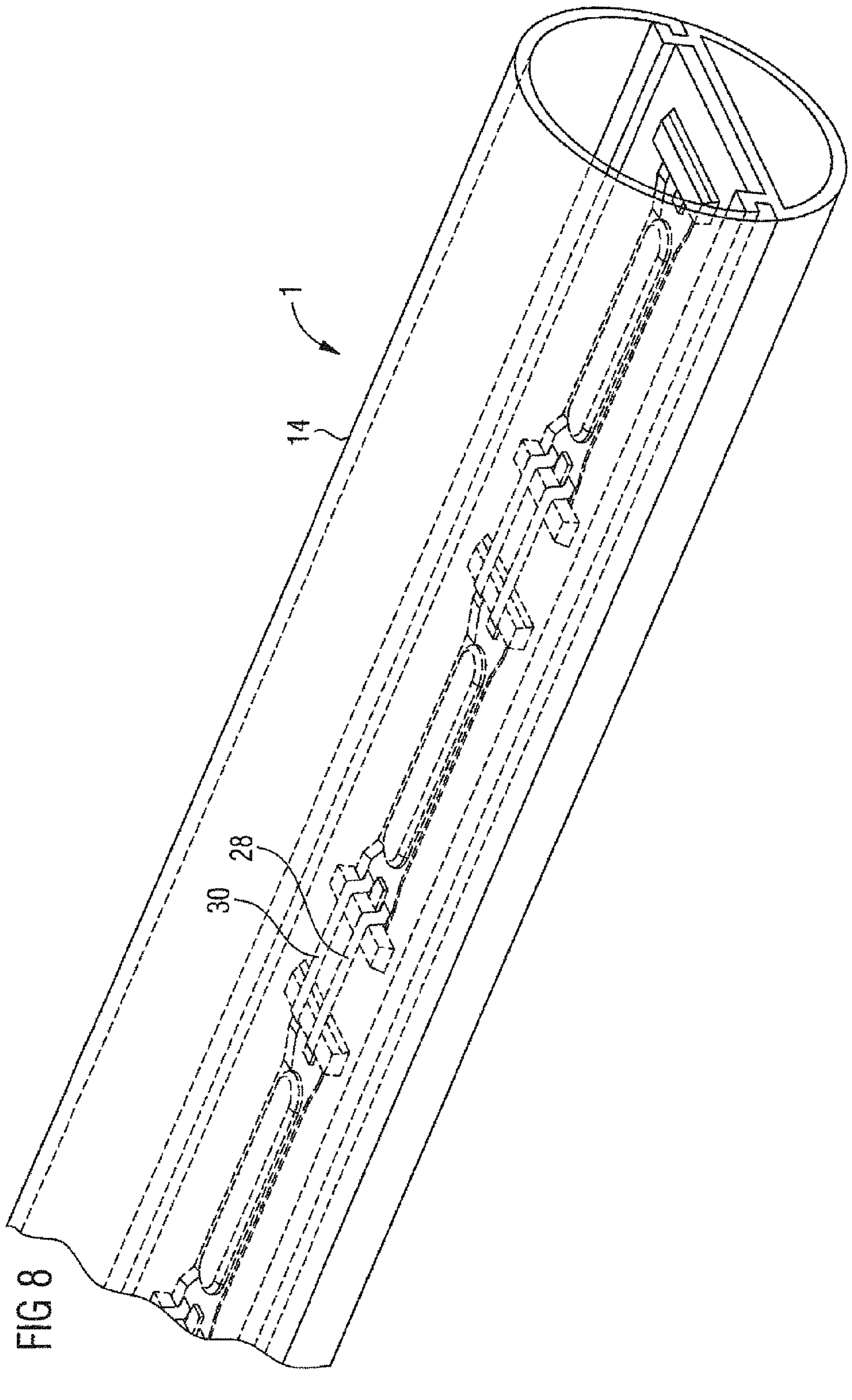
FIG. 8 shows a further embodiment of an LED lamp.

FIG. 8 shows an embodiment of a tube 14 of an LED lamp 1, the basic construction of which corresponds in principle to that from FIG. 1. Instead of a plurality of LEDs 2 arranged on a substrate module 16, however, in the embodiment in accordance with FIGS. 8 and 9, a multichip LED module, hereinafter called multichip LED 66, is used, to which power is supplied via two conductor tracks 18, 20 formed on the substrate module 16. Said conductor tracks run—in a manner similar to that in the embodiment described above—somewhat parallel in the longitudinal direction of the substrate module 16 and in turn have contact regions 22*a*, 22*b* at their end sections. In the case of such multichip LEDs 66, it is possible to use, in principle, LEDs or semiconductor light sources of all designs, the required safety distances already being complied with on the multichip module. An elongate configuration of the multichip LED 66 improves the illumination and provides for more uniform heat distribution. In a manner similar to that in the embodiment described above, the individual substrate modules 16 are brought into contact in a series circuit, said substrate modules being arranged in a manner lying one behind another in the longitudinal direction, thereby forming a virtually continuous LED line with very uniform illumination.

Figure 9:
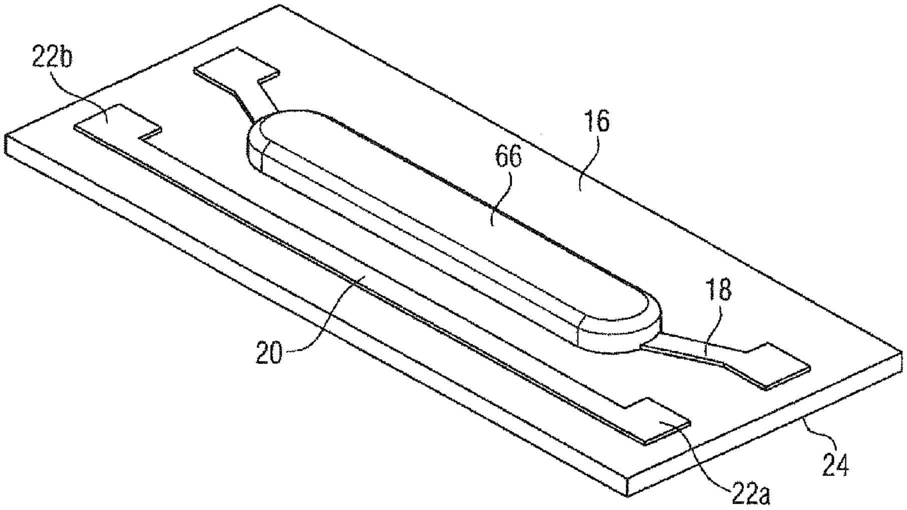
FIG. 9 shows a substrate module of the LED lamp from FIG. 6.

For the rest, the embodiment in accordance with FIGS. 8 and 9 corresponds to the embodiment described initially, that is to say that the electrical interconnection of the substrate modules 16 is preferably effected via the bridges 28, 30 already explained, which are placed in the manner of a clip connection and bear with prestress on the contact regions 22*a*, 22*b*. The series-connected conductor tracks 18, 20 are connected at the end side via a bridge clip 60 in accordance with FIG. 9 and the power supply is effected via power supply wires 48, 50.

Figure 10:
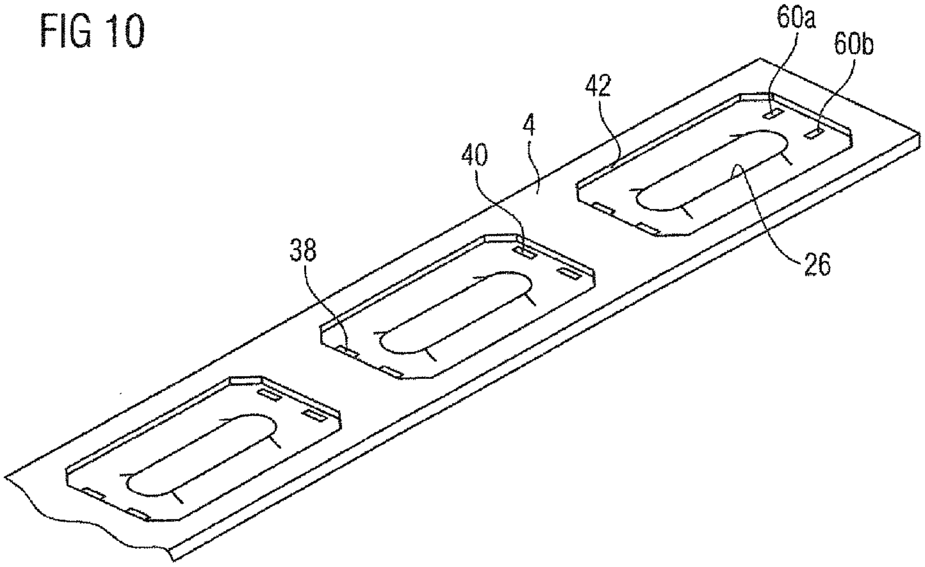
FIG. 10 shows a bottom view of a reflector for LED lamps in accordance with FIGS. 1 to 7.
Figure 11:
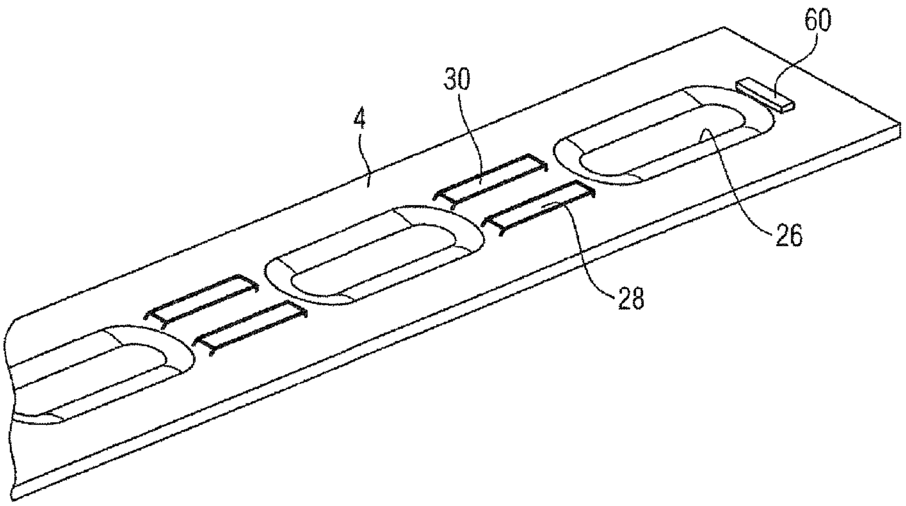
FIG. 11 shows a plan view of the reflector in accordance with FIG. 10.
Figure 12:
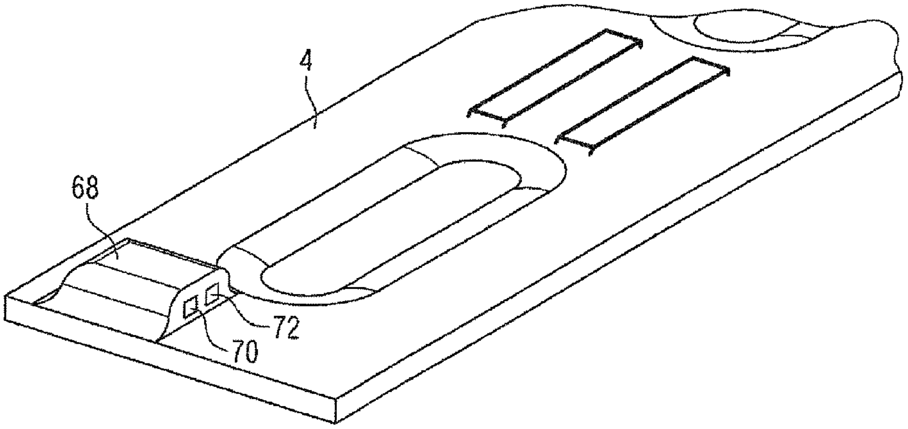
FIG. 12 shows a detail illustration of the reflector in accordance with FIG. 10.

With reference to FIGS. 10 to 12, a variant will be explained in which the bridges 28, 30 are not clipped on, but rather are potted with the reflector or injection-molded into the latter. FIG. 10 shows a view from below of the reflector 4. The cutouts 42, only partially illustrated in FIG. 5, can clearly be discerned, the contour of said cutouts being adapted to that of the substrate modules 16, such that the latter can be inserted with an accurate fit, wherein the rear side of the substrate modules 16 facing away from the two LEDs 2 is flush with the large surface of the reflector 4. FIG. 10 shows a reflector 4 for multichip LEDs 66 with perforations 26 which are shaped correspondingly in an elongate fashion and through which the LEDs extend. The electrical contact-making with the conductor tracks 18, 20 of the individual substrate modules 16 is in turn effected by bridges 28, 30 (see FIG. 11), which however—as already mentioned—are embedded into the reflector 4. In this case, the bridges 28, 30, as indicated in FIG. 11, may still project from the emission-side large surface of the reflector 4. In principle, however, said bridges may also be completely encapsulated by injection molding or potting. The respective end sections 38, 40 of each bridge 28, 30 penetrate through the reflector 4 and project into the space created by the cutouts 42, such that they bear against the corresponding contact regions 22*a*, 22*b* of the conductor tracks 18, 20 upon insertion of the substrate modules 16 and the individual substrate modules 16 are connected in series. In this case, it is necessary to observe the safety regulations mentioned initially with regard to their material thicknesses.

In the embodiment in accordance with FIG. 10, the contact-connection of the conductor tracks 18, 20 for the purpose of closing the electric circuit is in turn effected via a bridge clip 60, but in this variant said bridge clip is embedded into the reflector 4 and projects with its free end sections 60*a*, 60*b* (FIG. 10) into the cutout 42 assigned to the “last” substrate module 16, in order to connect the two conductor tracks 18, 20 of this module. On the power supply side, the lighting device can be embodied in accordance with the embodiments described above.

FIG. 12 shows a variant in which two supply lines which may be connected to the conductor tracks 18, 20 protrude with their end sections from an integrally cast/integrally injection-molded connection block 68 and thus form two pins 70, 72, to which a commercially available plug (not illustrated) can be attached. The latter can then be latched to the reflector 4, for example. Contact is then made with the multichip LEDs 66 by attaching said plug and connecting the individual substrate modules 16 in series.

Figure 13:
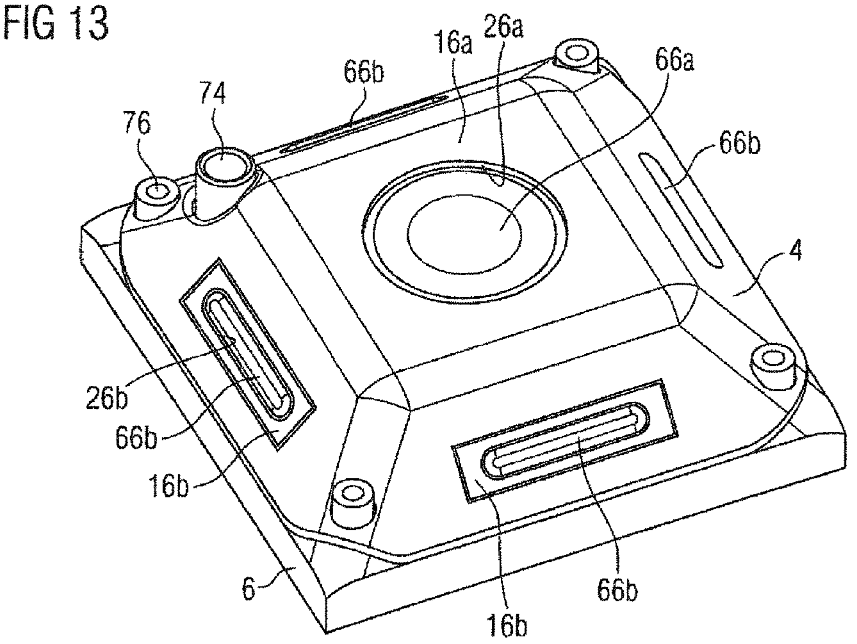
FIG. 13 shows a luminaire produced according to the concept according to the disclosure with a three-dimensional reflector.

In the embodiments described above, the construction according to the disclosure was realized with a multiplicity of substrate modules 16 held by a reflector 4 or a plurality of reflector parts, in the case of a tubular lamp. In principle, however, the disclosure may also be used in the case of arbitrary luminaires having more complex, three-dimensional structures. FIG. 13 shows an embodiment of a luminaire including a plurality of LEDs or multichip LEDs 66*a*, 66*b* of different designs, which are in each case accommodated on a ceramic substrate module 16*a* or 16*b*. In a manner similar to that in the case of the embodiment described previously, these substrate modules 16 carrying the multichip LEDs or the conventional LEDs 2, 66 are inserted into a reflector 4, which, in the embodiment illustrated, has an approximately pot-shaped construction having a base surface and side surfaces placed obliquely with respect thereto, the LEDs 66 being arranged on said side surfaces and the base surfaces. The LEDs 2 or the multichip LEDs 66 in each case pass through a correspondingly designed perforation 26*a* or 26*b* of the reflector 4, such that the light is emitted outward, toward the observer, the substrate modules described not being visible, or being only partially visible, in the illustration in accordance with FIG. 13.

Figure 14:
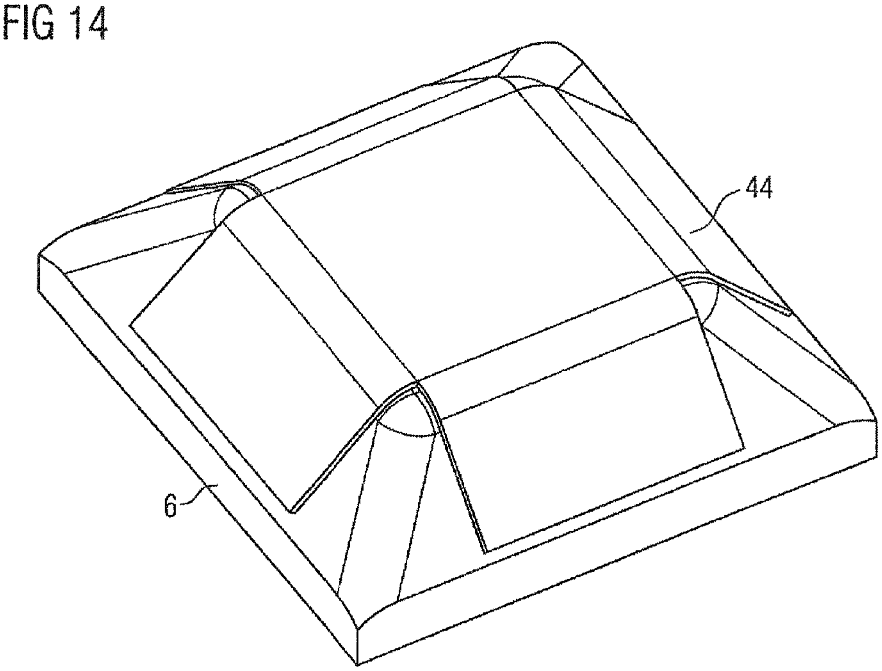
FIG. 14 shows a heat sink of the luminaire from FIG. 13.
Figure 15:
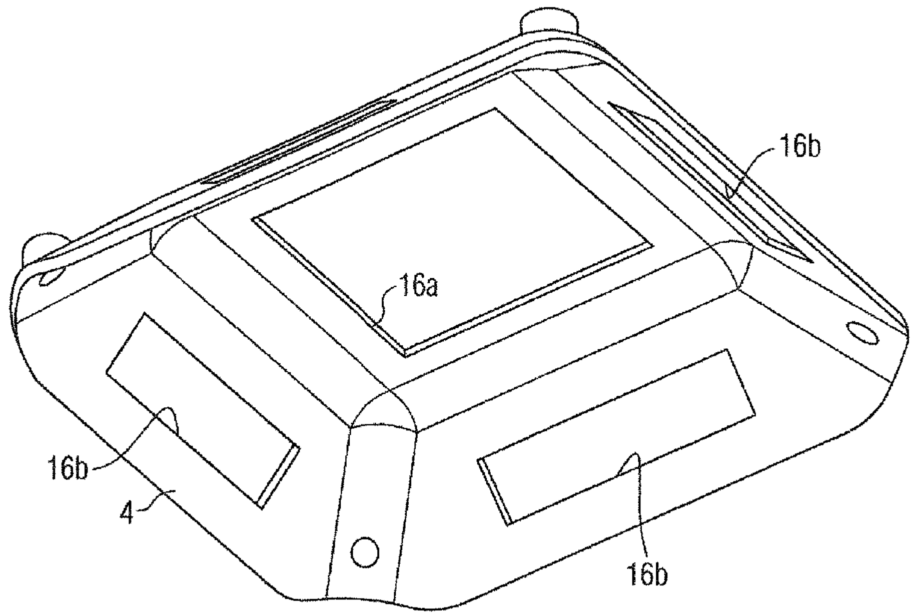
FIG. 15 shows a reflector of the luminaire in accordance with FIG. 13.

Contact is made with the substrate modules 16 equipped with the multichip LEDs 66 or the conventional LEDs 2 once again via attached or embedded bridges, which are not illustrated, however, in the embodiment in accordance with FIGS. 13 to 15. In accordance with FIG. 13, the pot-like reflector 4 carrying the substrate modules 16 is placed onto a heat sink 6 having corresponding geometry, wherein, in accordance with FIG. 14, a TIM layer 44 is formed between the heat sink 6 and the inner lateral surfaces of the reflector 4 and the substrate modules 16 held thereon. FIG. 15 shows an individual illustration of the reflector 4 having the cutouts 16*a*, 16*b* for the LEDs 2 or the multichip LEDs 66. Electrical contact is made with the substrate modules 16 with the LEDs 2, 66 for example via a brushing 74, through which the power supply leads may extend. The connection between reflector 4 and heat sink 6 and also TIM 44 can be effected by screws, extensions 76 being provided on the reflector 4 for said screws, the screws passing through said extensions in order to brace the components to one another.

In this way, it is possible to equip extremely complex geometries with semiconductor light sources, without necessitating a flexible configuration or a complex shaping of the substrate.

The above-described safe-to-touch construction of lamps and luminaires by virtue of the use according to the disclosure of ceramic substrate modules 16 has the advantage over the variants with SELV voltage that comparatively high voltage can be employed and a higher efficiency can thus be achieved. Furthermore, the use of the concept according to the disclosure does not require a cost-intensive SELV transformer. Moreover, the need for an additional substrate as carrier material for the LEDs, as described in DE 10 2008 039 364 A1, for example, is obviated with the use of multichip LEDs. The disclosure also does not require the use of metal-core circuit boards required in conventional solutions (likewise see the prior art cited above), such that the lighting device can be made significantly lighter than conventional solutions.

What is disclosed is a lighting device including a plurality of semiconductor light sources arranged on a substrate. According to the disclosure, said substrate consists of a multiplicity of substrate modules provided with conductor tracks for making contact with the respective semiconductor light source.

While the disclosed embodiments has been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting device comprising a plurality of semiconductor light sources arranged on a substrate which is brought into contact thermally with a heat sink, wherein the substrate is formed from a multiplicity of substrate modules which are held by a carrier and which each carry at least one semiconductor light source and are brought into contact electrically with one another;

wherein the substrate modules are attached to a reflector; and wherein the reflector has a multiplicity of cutouts on the rear side, a substrate module being inserted into each of said cutouts.

2. The lighting device as claimed in patent claim 1, wherein the substrate module substantially consists of ceramic.

3. The lighting device as claimed in patent claim 1, wherein the reflector carries a multiplicity of substrate modules.

4. The lighting device as claimed in patent claim 1, wherein the substrate module has two conductor tracks for making contact with the semiconductor light sources.

5. The lighting device as claimed in patent claim 4, wherein the conductor tracks are arranged approximately parallel to one another and the semiconductor light sources are arranged along the conductor tracks.

6. The lighting device as claimed in patent claim 4, wherein the conductor tracks of a substrate module at the end side are electrically connected to one another.

7. The lighting device as claimed in patent claim 1, wherein a plurality of LEDs are combined to form a multichip LED.

8. The lighting device as claimed in claim 1, wherein the substrate modules are brought into contact electrically via bridges extending between adjacent modules.

9. The lighting device as claimed in patent claim 8, wherein the bridges are attached to the reflector.

10. The lighting device as claimed in patent claim 9, wherein the bridges are inserted into the reflector in a force-locking manner.

11. The lighting device as claimed in patent claim 1, wherein the substrate modules are arranged, in a manner lying one behind another, in a tube formed by a cover and heat sink.

12. The lighting device as claimed in patent claim 1, wherein the substrate modules are inserted into walls of a three-dimensionally embodied reflector.

13. The lighting device as claimed in patent claim 1, wherein a layer composed of thermal interface material is assigned to the heat sink.

14. A lighting device comprising a plurality of semiconductor light sources arranged on a substrate which is brought into contact thermally with a heat sink, wherein the substrate is formed from a multiplicity of substrate modules which are held by a carrier and which each carry at least one semiconductor light source and are brought into contact electrically with one another; and wherein the substrate modules are brought into contact electrically via bridges extending between conductor tracks of the substrate modules.

15. The lighting device as claimed in patent claim 8, wherein the bridges are integrated into the reflector.

16. The lighting device as claimed in patent claim 14, wherein the bridges are inserted into the reflector in a force-locking manner.

* * * * *